United States Patent [19]

Suemitsu et al.

[11] Patent Number: 4,603,473
[45] Date of Patent: Aug. 5, 1986

[54] METHOD OF FABRICATING INTEGRATED SEMICONDUCTOR CIRCUIT

[75] Inventors: Takashi Suemitsu; Takashi Niriki, both of Kofu, Japan

[73] Assignee: Pioneer Electronic Corporation, Tokyo, Japan

[21] Appl. No.: 541,317

[22] Filed: Oct. 12, 1983

[30] Foreign Application Priority Data

Oct. 13, 1982 [JP] Japan ................................ 57-179354

[51] Int. Cl.⁴ ............................................. H05K 3/06
[52] U.S. Cl. ....................................... 29/578; 29/574; 29/576 B; 250/492.2; 250/491.1; 250/492.3; 156/643
[58] Field of Search ..................... 29/574, 578, 576 B; 250/492.2, 491.1, 492.3; 156/643

[56] References Cited

U.S. PATENT DOCUMENTS

| | | | |
|---|---|---|---|
| 3,742,229 | 6/1973 | Smith et al. | 250/65 R |
| 3,875,414 | 4/1975 | Prior | 250/492 |
| 3,876,883 | 4/1975 | Broers et al. | 250/492 |
| 4,057,347 | 11/1977 | Moriyama | 355/67 |
| 4,310,743 | 1/1982 | Seliger | 219/121 EB |
| 4,322,626 | 3/1982 | Kawashima | 250/492.2 |
| 4,370,554 | 1/1983 | Bohlen et al. | 250/491.1 |
| 4,403,151 | 9/1983 | Mochiji et al. | 250/492.2 |
| 4,442,361 | 4/1984 | Zasio et al. | 250/492.2 |
| 4,443,704 | 4/1984 | Yamashita et al. | 250/491.1 |

FOREIGN PATENT DOCUMENTS 58-39015  3/1983  Japan ..................................... 29/578

Primary Examiner—Donald L. Walton
Assistant Examiner—Hunter L. Auyang
Attorney, Agent, or Firm—Fleit, Jacobson, Cohn & Price

[57] ABSTRACT

A method of fabricating an integrated semiconductor circuit device having a plurality of layers of circuit patterns, comprising forming the circuit pattern of at least one of the above mentioned layers by a direct exposure method using an electron beam, and forming the circuit pattern of at least one of the remaining layers by a light exposure method using a photomask.

4 Claims, 6 Drawing Figures

Fig. 1A   Fig. 1B   Fig. 1C
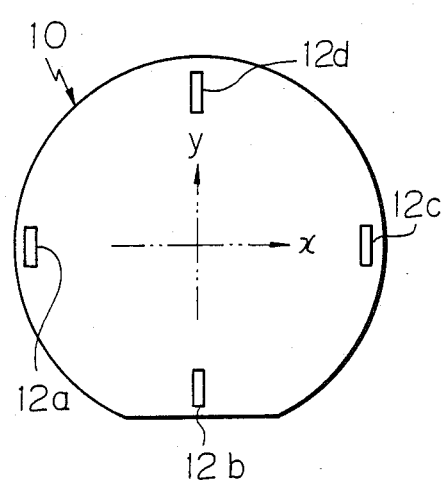
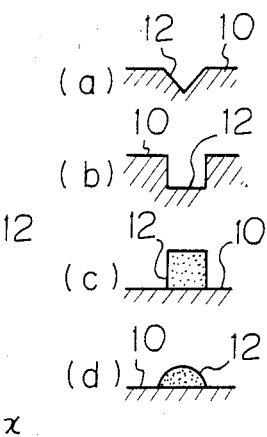
Fig. 2
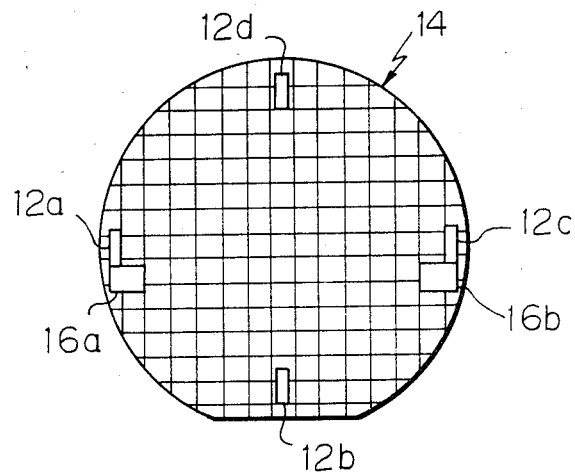

METHOD OF FABRICATING INTEGRATED SEMICONDUCTOR CIRCUIT

FIELD OF THE INVENTION

The present invention relates to a method of fabricating semiconductor circuit devices and, particularly, to a method of forming patterns of desired circuit components on a semiconductor wafer to fabricate an integrated semiconductor circuit device.

BACKGROUND OF THE INVENTION

An integrated semiconductor circuit device is ordinarily produced by successively forming patterns of desired circuit components on the surface of a semiconductor wafer. Two methods are known to produce such semiconductor integrated circuits, one being the light exposure method using photomasks and the other being the direct or unmasked exposure method using an electron beam. The direct exposure method using an electron beam dispenses with a masking medium and is useful for forming circuit patterns with the fineness of the order of 1 micron or less since the semiconductor wafer is irradiated directly with the electron beam on the basis of prescribed master data. Another advantage of the direct electron-beam exposure method is the reduction in the period of time required for the fabrication of the semiconductor integrated circuits. Such an advantage is of importance especially where a small number of semiconductor integrated circuit devices are to be fabricated for research and development use.

To produce a semiconductor integrated circuit device by the known direct exposure method using an electron beam, registration marks are first formed on the surface of the semiconductor wafer by, for example, a photoresist etching process. The registration marks thus provided on the wafer are probed by an electron beam during formation of a circuit pattern of each layer so that the circuit patterns of the individual layers accurately register with each other. The patterns of the desired circuit components formed on the semiconductor wafer in this fashion can be located on the wafer far more accurately than the circuit patterns produced by the light exposure method using photomasks. It is known that the errors caused in locating the patterns in a semiconductor integrated circuit fabricated by this direct exposure method can be reduced to the order of 1 micron or even less.

A photomask used in the prior-art light exposure method has provided thereon not only the circuit patterns to be produced but also the target marks in accordance with which the circuit patterns are to be located on the semiconductor wafer. Each of the photomasks carrying the patterns of the individual layers is positioned on a semiconductor wafer by using the target marks as references for correctly positioning the photomasks on the wafer. The light exposure method using such masking media has drawbacks in that not only a relatively long period of time is required for the preparation of the photomasks but it is difficult to form patterns with a satisfactory degree of fineness. The fineness of the circuit patterns produced by the light exposure method is usually of the order of about 2 microns or more.

These drawbacks of the light exposure method are not involved in the direct exposure method using an electron beam and dispensing with a photomask. A problem is however encountered in the conventional direct exposure method in that too much time must be expended for the irradiation of the semiconductor wafer with an electron beam until the circuit patterns of all the layers are produced on the wafer.

The drawbacks inherent in the two prior-art exposure methods could be eliminated if such methods are combined together. Combining these methods together had however been believed technically impossible until such an attempt was realized by the invention disclosed in Japanese patent application No. 56-137445 filed on Sept. 1, 1981 in the name of Pioneer Electronic Corporation, Japan. The difficulty of combining these methods together results primarily from the incompatibility between the registration marks used in the electron-beam exposure method and the target marks used in the light exposure method. Thus, the invention disclosed in the named patent application owes to the success achieved in providing compatibility between the two kinds of reference marks.

SUMMARY OF THE INVENTION

It is accordingly an object of the present invention to provide a method of fabricating a semiconductor circuit device by utilizing both of the light exposure method using a photomask and the direct exposure method using an electron beam so as to exploit the advantages of the two exposure methods.

In accordance with one important aspect of the present invention, such an object is accomplished by a method of fabricating an integrated semiconductor circuit device having a plurality of layers of circuit patterns, comprising forming the circuit pattern of at least one of the above mentioned layers by a direct exposure method using an electron beam, and forming the circuit pattern of at least one of the remaining layers by a light exposure method using a photomask.

In accordance with another important aspect of the present invention, there is provided a method of fabricating an integrated semiconductor circuit device, comprising forming at least one registration mark on a semiconductor wafer, forming a first layer of a circuit pattern on a semiconductor wafer and at least one target mark for a photomask by irradiating the semiconductor wafer with an electron beam by using the registration mark as a reference for locating the circuit pattern correctly on the semiconductor wafer, forming at least one additional semiconductor layer on the wafer, and irradiating the additional semiconductor layer with light through the photomask positioned on the wafer by using the target mark as a reference for correctly positioning the photomask with respect to the wafer.

In accordance with still another important aspect of the present invention, there is provided a method of fabricating an integrated semiconductor circuit device, comprising preparing a photomask which is provided with a pattern representative of at least one registration mark, forming at least one target mark on a semiconductor wafer, forming a first layer of a circuit pattern and at least one registration mark on a semiconductor wafer by irradiating the semiconductor wafer with light through a photomask positioned on the wafer by using the target mark as a reference for correctly positioning the photomask with respect to the wafer, forming at least one additional semiconductor layer on the wafer, and irradiating the additional semiconductor layer with an electron beam by using the registration mark as a reference for locating the circuit pattern correctly on the semiconductor wafer.

BRIEF DESCRIPTION OF THE DRAWINGS

The features and advantages of a method according to the present invention will be more clearly appreciated from the following description taken in conjunction with the accompanying drawings in which like reference numerals designate similar or corresponding members and elements and in which:

FIG. 1A is a plan view showing a semiconductor wafer conventionally used in the direct exposure method using an electron beam for the fabrication of an integrated semiconductor circuit device;

FIG. 1B is a plan view showing, to an enlarged scale, the configuration of a set of registration marks formed on the semiconductor wafer shown in FIG. 1A;

FIG. 1C is a view showing, to a further enlarged scale, examples of the cross sectional configurations of each of the registration marks shown in FIG. 1B;

FIG. 2 is a plan view showing a semiconductor wafer used in a method according to the present invention for the fabrication of an integrated semiconductor circuit device;

DETAILED DESCRIPTION OF THE INVENTION

Figure 3:
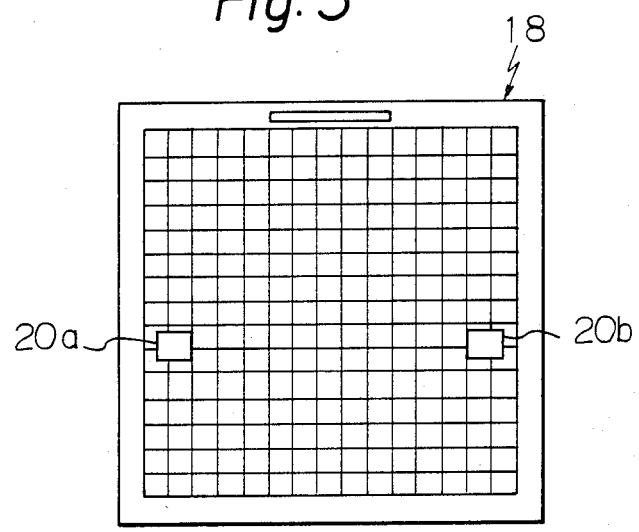
FIG. 3 is a plan view showing an example of the photomask used to carry out the light exposure method in a method according to the present invention.

Referring to FIG. 1A of the drawings, a generally discshaped semiconductor wafer 10 used for carrying out the known direct electron-beam exposure method has formed on one of its surfaces four sets of registration marks 12a, 12b, 12c and 12d disposed at predetermined locations of the wafer 10.. In FIG. 1A, the four sets of registration marks 12a, 12b, 12c and 12d are shown located in such a manner that one pair of registration marks 12a and 12c are located on an imaginary axis of abscissa x and the other pair of registration marks 12b and 12d are located on an imaginary axis of ordinate y. As shown in FIG. 2B, each of these four sets of registration marks 12a, 12b, 12c and 12d consists of an array of registration marks 12 each of which is composed of two line segments perpendicularly crossing each other and extending in directions parallel with The above mentioned imaginary axes x and y, respectively. Each of the registration marks 12 is sunk in the semiconductor wafer 10 with a V-shaped cross section or a rectangular cross section as shown in (a) or (b), respectively, of FIG. 1C or is protuberant on the surface of the wafer 10 with a rectangular cross section or a generally semicircular cross section as shown in (c) or (d), respectively, of FIG. 1C.

Turning to FIG. 2 of the drawings, a semiconductor wafer 14 used in a method according to the present invention has formed on one of its surfaces not only the four sets of registration marks 12a, 12b, 12c and 12d arranged as above described but also two target marks 16a and 16b disposed at predetermined locations on the wafer 14. In FIG. 2, the target marks 16a and 16b are shown, by way of example, as being located adjacent the registration marks 12a and 12c, respectively, which are located on the axis of abscissa x. Each of the registration marks 12a to 12d provided on the semiconductor wafer 14 may also have the cross sectional configuration shown in any of (a) to (d) of FIG. 1C. The cross sectional configurations of the registration marks herein shown are however merely for the purpose of illustration and are thus not limitative of the cross sectional configurations of the registration marks 12a to 12d provided on the semiconductor wafer 14 in a method according to the present invention. While, furthermore, there are shown four sets of registration marks 12a, 12b, 12c and 12d located on perpendicularly intersecting lines on the semiconductor wafer 14, less or more than four sets of registration marks may be provided and located in a suitable manner on the wafer 14, though not shown in the drawings. The registration marks 12a to 12d may be formed on the semiconductor wafer 14 by, for example, the direct electron-beam exposure method although the ordinary photoresist etching process can be utilized for this purpose. The target marks 16a and 16b may also be formed on by the direct electron-beam exposure method. The semiconductor wafer 14 initially has a p-type or n-type semiconductor layer lying on a suitable base layer and is assumed to consist of a myriad of sections each to form a chip carrying circuit patterns.

The initial semiconductor layer of the wafer 14 thus provided with the registration marks 12a, 12b, 12c and 12d is processed to form a circuit pattern of the undermost layer by the direct electron-beam exposure method. For this purpose, the semiconductor layer of the wafer 14 is irradiated with an electron beam with the aid of the registration marks 12a to 12d so that the circuit pattern to be formed is located correctly on the semiconductor wafer 14. Thereupon, another semiconductor layer which differs in type from the initial semiconductor layer is formed on the wafer 14 and a circuit pattern is formed by irradiating this additional layer either with an electron beam or with light such as for example ultraviolet or far-ultraviolet light. Where the direct electron-beam method is to be adopted for the formation of the circuit pattern of this second layer, the registration marks 12a to 12d are used as references for locating the circuit pattern of the second layer correctly with respect to the circuit pattern of the first layer. If, on the other hand, the light exposure method using a photomask is preferred, the target marks 16a and 16b are used as references for correctly positioning the photomask on the wafer. Upon completion of the formation of the circuit pattern of the second layer, a third semiconductor layer may be formed on the wafer 14 and processed to form a circuit pattern either by the direct electron-beam exposure method or the light exposure method. A plurality of circuit patterns are in this manner produced in layers on the base layer of the semiconductor wafer 14 until the required circuit components are completely formed in each of the individual sections of the semiconductor wafer 14.

Figure 4:
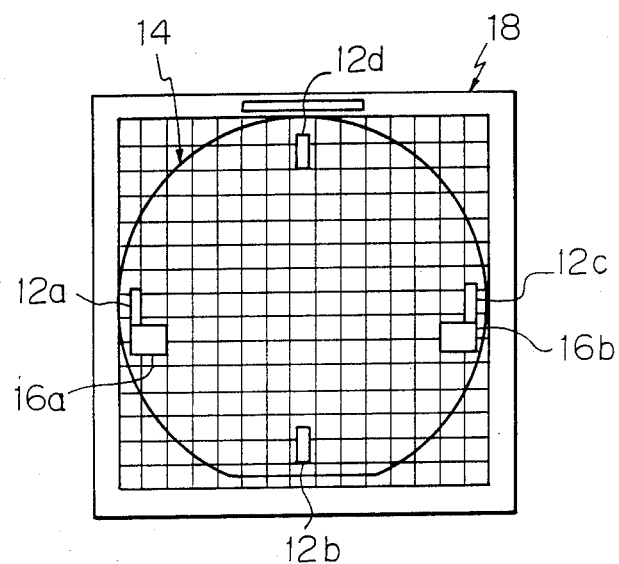
FIG. 4 is a plan view showing the combination of the semiconductor wafer shown in FIG. 2 and the photomask placed on the wafer.

FIG. 3 of the drawings shows an example of the photomask used in the light exposure method which may be carried out for the formation of the circuit pattern of the second layer or any of the layers overlying the circuit pattern of the first or undermost layer as above described. The photomask, designated in its entirety by reference numeral 18, has provided thereon two target marks 20a and 20b which are identical in shape and location to the corresponding target marks 16a and 16b, respectively, on the semiconductor wafer 14. Though not shown, the photomask 18 has also applied thereto a pattern of suitable circuit components to be reproduced on the semiconductor wafer 14.

Where the circuit pattern of the second layer or any of the layers overlying the circuit pattern of the first or undermost layer is to be formed by the light exposure method, the photomask 18 illustrated in FIG. 3 is superposed on the semiconductor wafer 14 shown in FIG. 2 in such a manner that the target marks 20a and 20b on the former correctly register with the target marks 16a and 16b, respectively, on the latter, as shown in FIG. 4. The semiconductor wafer 14 is thereafter irradiated with light through the clear areas of the photomask 18 as is customary in the art. If it is desired to form a circuit pattern by the direct electron-beam exposure method subsequently to the formation of a circuit pattern by the light exposure method, the circuit pattern to be formed is correctly located with respect to the circuit pattern of the underlying layer by using the registration marks 12a to 12d on the wafer 14 as references.

As will have been understood from the foregoing description, the conventional light and elctron-beam exposure methods which have been considered incompatible with each other can be successfully combined together in a method according to the present invention. In carrying out a method according to the present invention, the direct electron beam exposure method will be preferred for the formation of the circuit pattern of a layer requiring an extra degree of preciseness and/or where there is no sufficient time allowed for the preparation of a photomask. On the other hand, the light exposure method will be preferred where it is desired to reduce the time for the irradiation of the semiconductor wafer.

Where a method according to the present invention is to be applied to the fabrication of integrated semiconductor circuit devices by a master slice method, it is preferable for the economy of time to use the light exposure method for the formation of the circuit patterns of the layers except for the first layer and the direct electron-beam exposure method for the formation of the patterns of the aluminum wiring layers which are subject to variation. If, in this instance, not only the circuit pattern of the first layer but also the target marks on the semiconductor wafer are formed by the direct electron-beam method, a satisfactory degree of preciseness and fineness will be achieved in producing the circuit patterns of all the layers.

If desired, the circuit pattern of the first layer may be formed by the light exposure method using the photomask 18 in lieu of the direct electron-beam exposure method. The photomask 18 to be used for such a process is preliminarily provided with a pattern representative of the registration marks 12a to 12d to be formed on the semiconductor wafer 14. The target marks 16a and 16b (FIG. 2) for the positioning of the photomask 18 (FIG. 3) may be formed on the semiconductor wafer 14 by the direct electron-beam exposure method prior to the formation of the circuit pattern of the first layer. The circuit pattern of the first layer is then formed on the semiconductor wafer 14 by the light exposure method with the photomask 18 positioned on the wafer 14 with the aid of the target marks 16a and 16b thus formed on the wafer 14. Thereupon, the registration marks 12a to 12d are formed on the semiconductor wafer 14 by the light exposure method with use of the pattern of the registration marks preliminarily provided on the photomask 18. The circuit patterns of the layers overying the circuit pattern of the first layer are thereafter formed on the wafer 14 selectively by the light exposure method and/or the direct electron-beam exposure method.

It will have been understood from the foregoing description that the light exposure method and the direct electron-beam exposure method have thus far been believed incompatible with each other can be combined effectively for forming circuit patterns on a single semiconductor wafer by a method according to the present invention. A method according to the present invention is thus expected to provide the advantages of both of these two methods in fabricating an integrated semiconductor circuit device:

What is claimed is:

1. A method of fabricating an integrated semiconductor circuit device having a plurality of layers of circuit patterns, comprising
    forming the circut pattern of at least one of said layers and at least one target mark for a photomask by a direct exposure method using an electron beam, and
    forming the circuit pattern of at least one of the remaining layers by a light exposure method using the photomask positioned by means of said target mark.

2. A method of fabricating an integrated semiconductor circuit device, comprising
    forming at least one registration mark on a semiconductor wafer,
    forming a first layer of a circuit pattern on a semiconductor wafer and at least one target mark for a photomask by irradiating the semiconductor wafer with an electron beam by using said registration mark as a reference for locating the circuit pattern correctly on the semiconductor wafer,
    forming at least one additional semiconductor layer on said wafer, and
    irradiating said additional semiconductor layer with light through the photomask positioned on the wafer by using said target mark as a reference for correctly positioning the photomask with respect to the wafer.

3. A method of fabricating an integrated semiconductor circuit device, comprising
    preparing a photomask which is preliminarily provided with a pattern representative of at least one registration mark to be formed on said semiconductor wafer.
    forming at least one target mark on a semiconductor wafer by irradiating the semiconductor wafer with an electron beam,
    forming a first layer of a circuit pattern and at least one registration mark on a semiconductor wafer by irradiating the semiconductor wafer with light through a photomask positioned on the wafer by using said target mark as a reference for correctly positioning the photomask with respect to the wafer,
    forming at least one additional semiconductor layer on said wafer,
    irradiating said additional semiconductor layer with an electron beam by using said registration mark as a reference for locating the circuit pattern correctly on the semiconductor wafer, and
    preparing a photomask which is preliminarily provided with a pattern representative of at least one registration mark to be formed on said semiconductor wafer.

4. A method as set forth in claim 2, in which said registration mark on the semiconductor wafer is formed by irradiating the semiconductor wafer with an electron beam.

* * * * *